United States Patent
Park et al.

(10) Patent No.: US 9,525,432 B2
(45) Date of Patent: Dec. 20, 2016

(54) LOW DENSITY PARITY CHECK ENCODER HAVING LENGTH OF 64800 AND CODE RATE OF 3/15, AND LOW DENSITY PARITY CHECK ENCODING METHOD USING THE SAME

(71) Applicant: Electronics and Telecommunications Research Institute, Daejeon (KR)

(72) Inventors: Sung-Ik Park, Daejeon (KR); Heung-Mook Kim, Daejeon (KR); Sun-Hyoung Kwon, Daejeon (KR); Nam-Ho Hur, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 98 days.

(21) Appl. No.: 14/496,627

(22) Filed: Sep. 25, 2014

(65) Prior Publication Data
US 2016/0049958 A1    Feb. 18, 2016

(30) Foreign Application Priority Data

Aug. 14, 2014 (KR) .................. 10-2014-0106179
Sep. 11, 2014 (KR) .................. 10-2014-0120013

(51) Int. Cl.
*H03M 13/11*    (2006.01)
*H03M 13/00*    (2006.01)
(Continued)

(52) U.S. Cl.
CPC ....... *H03M 13/1102* (2013.01); *H03M 13/116* (2013.01); *H03M 13/1185* (2013.01); *H04L 1/0057* (2013.01)

(58) Field of Classification Search
CPC ............ H03M 13/1102; H03M 13/255; H03M 13/616; H03M 13/116; H03M 13/1157; H03M 13/1177; H04L 1/0057; H04L 1/0043

See application file for complete search history.

(56) References Cited

U.S. PATENT DOCUMENTS 7,802,172 B2 * 9/2010 Vila Casado ...... H03M 13/1185
                                                    714/801
8,060,805 B2 * 11/2011 Kyung ................... H03M 13/11
                                                    714/752
(Continued)

FOREIGN PATENT DOCUMENTS

KR    10-2007-0058438        6/2007
KR    10-2013-0135746 A      12/2013
WO    WO 2006/001666 A2      1/2006

OTHER PUBLICATIONS

Yiyan Wu et al., "Cloud Transmission: A New Spectrum-Reuse Friendly Digital Terrestrial Broadcasting Transmission System", IEEE Transactions on Broadcasting, Sep. 2012, pp. 329-337, vol. 58, No. 3.

(Continued)

*Primary Examiner* — Phung M Chung

(57) ABSTRACT

A low density parity check (LDPC) encoder includes first memory, second memory, and a processor. The first memory stores an LDPC codeword having a length of 64800 and a code rate of 3/15. The second memory is initialized to 0. The processor generates the LDPC codeword corresponding to information bits by performing accumulation with respect to the second memory using a sequence corresponding to a parity check matrix (PCM).

4 Claims, 5 Drawing Sheets

(51) Int. Cl.
*H04L 1/00* (2006.01)
*G06F 11/10* (2006.01)

(56) References Cited

U.S. PATENT DOCUMENTS

| | | | | |
|---|---|---|---|---|
| 9,225,358 | B2* | 12/2015 | Park | H03M 13/116 |
| 2008/0178065 | A1 | 7/2008 | Khandekar et al. | |
| 2014/0157079 | A1 | 6/2014 | Park et al. | |
| 2015/0100844 | A1* | 4/2015 | Park | H03M 13/1177 |
| | | | | 714/752 |
| 2015/0229335 | A1* | 8/2015 | Park | H03M 13/2792 |
| | | | | 714/776 |
| 2015/0236722 | A1* | 8/2015 | Park | H03M 13/036 |
| | | | | 714/776 |
| 2015/0270854 | A1* | 9/2015 | Park | H03M 13/09 |
| | | | | 714/776 |
| 2015/0341047 | A1* | 11/2015 | Park | G06F 11/1076 |
| | | | | 714/766 |
| 2015/0341048 | A1* | 11/2015 | Park | G06F 11/1076 |
| | | | | 714/766 |
| 2016/0049952 | A1* | 2/2016 | Park | H03M 13/1102 |
| | | | | 714/776 |
| 2016/0049953 | A1* | 2/2016 | Park | H03M 13/1102 |
| | | | | 714/776 |
| 2016/0049954 | A1* | 2/2016 | Park | H04L 1/0057 |
| | | | | 714/776 |
| 2016/0049955 | A1* | 2/2016 | Park | H04L 1/0057 |
| | | | | 714/776 |
| 2016/0049956 | A1* | 2/2016 | Park | H04L 1/0057 |
| | | | | 714/776 |
| 2016/0049957 | A1* | 2/2016 | Park | H03M 13/1102 |
| | | | | 714/776 |
| 2016/0049959 | A1* | 2/2016 | Park | H03M 13/1102 |
| | | | | 714/776 |
| 2016/0065242 | A1* | 3/2016 | Park | H03M 13/1102 |
| | | | | 714/776 |

OTHER PUBLICATIONS

"Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Sep. 26, 2013, pp. 1-101, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Oct. 21, 2013, pp. 1-138, CRC Canada and ETRI Korea.

"Updated Proposal to the ATSC 3.0 PHY Layer CfP Cloud Transmission for the ATSC 3.0 PHY Layer," A Joint Proposal by Communications Research Centre Canada and Electronics and Telecommunications Research Institute Korea, Dec. 5, 2013, pp. 1-138, CRC Canada and ETRI Korea.

"Digital Video Broadcasting (DVB); Frame structure channel coding and modulation for a second generation digital terrestrial television broadcasting system (DVB-T2)," Final draft ETSI EN 302 755, Oct. 2010, pp. 1-177, vol. 1.2.1, European Telecommunications Standards Institute, http://www.etsi.org/deliver/etsi_en/302700_302799/302755/01.02.01_40/en_302755v010201o.pdf.

* cited by examiner

LOW DENSITY PARITY CHECK ENCODER HAVING LENGTH OF 64800 AND CODE RATE OF 3/15, AND LOW DENSITY PARITY CHECK ENCODING METHOD USING THE SAME

CROSS-REFERENCE TO RELATED APPLICATIONS

This application claims the benefit of Korean Patent Application Nos. 10-2014-0106179 and 10-2014-0120013, filed Aug. 14, 2014 and Sep. 11, 2014, respectively, which are hereby incorporated by reference herein in their entirety.

BACKGROUND

1. Technical Field

The present disclosure relates generally to a low density parity check (LDPC) code that is used to correct errors occurring over a wireless channel, and, more particularly, to an LDPC code that is applicable to a digital broadcasting system.

2. Description of the Related Art

Current terrestrial television (TV) broadcasting generates co-channel interference across an area within a distance that is three times a service radius, and thus the same frequency cannot be reused in the area within the distance that is three times the service radius. An area in which the same frequency cannot be reused is called a white space. Spectrum efficiency significantly deteriorates due to the occurrence of a white space.

Accordingly, there arises a need for the development of a transmission technology that facilitates the elimination of a white space and the reuse of a frequency with an emphasis on reception robustness in order to improve spectrum efficiency.

In response to this, the paper "Cloud Transmission: A New Spectrum-Reuse Friendly Digital Terrestrial Broadcasting Transmission System" published on September of 2012 in IEEE Transactions on Broadcasting, Vol. 58, No. 3 proposes a terrestrial cloud transmission technology that facilitates reuse, does not generate a white space, and makes the construction and operation of a single frequency network easy.

Using this terrestrial cloud transmission technology, a broadcasting station can transmit the same nationwide content or locally different content over a single broadcasting channel. However, for this purpose, a receiver should receive one or more terrestrial cloud broadcast signals in an area in which signals transmitted from different transmitters overlap each other, that is, an overlap area, over a single frequency network, and then should distinguish and demodulate the received terrestrial cloud broadcast signals. That is, the receiver should demodulate one or more cloud broadcast signals in a situation in which co-channel interference is present and the timing and frequency synchronization between transmitted signals are not guaranteed.

Meanwhile, Korean Patent Application Publication No. 2013-0135746 entitled "Low Density Parity Check Code for Terrestrial Cloud Transmission" discloses an LDPC code that is optimized for terrestrial cloud transmission and exhibits excellent performance at low code rate (<0.5).

However, Korean Patent Application Publication No. 2013-0135746 is directed to a code length completely different from an LDPC code length used in the DVB broadcast standard, etc., and does not teach a specific LDPC encoding method.

SUMMARY

At least one embodiment of the present invention is directed to the provision of a new LDPC codeword having a length of 64800 and a code rate of 3/15, which is capable of being used for general purposes.

At least one embodiment of the present invention is directed to the provision of an LDPC encoding technique that is capable of efficiently performing LDPC encoding using a sequence having a number of rows equal to a value that is obtained by dividing the sum of the length of the systematic part of an LDPC codeword, that is, 12960, and the length of the first parity part of the LDPC codeword, that is, 1800, by 360.

In accordance with an aspect of the present invention, there is provided an LDPC encoder, including first memory configured to store an LDPC codeword having a length of 64800 and a code rate of 3/15; second memory configured to be initialized to 0; and a processor configured to generate the LDPC codeword corresponding to information bits by performing accumulation with respect to the second memory using a sequence corresponding to a parity check matrix (PCM).

The accumulation may be performed at parity bit addresses that are updated using the sequence corresponding to the PCM.

The LDPC codeword may include a systematic part corresponding to the information bits and having a length of 12960, a first parity part corresponding to a dual diagonal matrix included in the PCM and having a length of 1800, and a second parity part corresponding to an identity matrix included in the PCM and having a length of 50040.

The sequence may have a number of rows equal to the sum of a value obtained by dividing a length of the systematic part, that is, 12960, by a circulant permutation matrix (CPM) size corresponding to the PCM, that is, 360, and a value obtained by dividing a length of the first parity part, that is, 1800, by the CPM size.

The sequence may be represented by the following Sequence Table:

Sequence Table

1st row: 920 963 1307 2648 6529 17455 18883 19848 19909 24149 24249 38395 41589 48032 50313

2nd row: 297 736 744 5951 8438 9881 15522 16462 23036 25071 34915 41193 42975 43412 49612

3rd row: 10 223 879 4662 6400 8691 14561 16626 17408 22810 31795 32580 43639 45223 47511

4th row: 629 842 1666 3150 7596 9465 12327 18649 19052 19279 29743 30197 40106 48371 51155

5th row: 857 953 1116 8725 8726 10508 17112 21007 30649 32113 36962 39254 46636 49599 50099

Sequence Table -continued

6th row: 700 894 1128 5527 6216 15123 21510 24584 29026 31416 37158 38460 42511 46932 51832
7th row: 430 592 1521 3018 10430 18090 18092 18388 20017 34383 35006 38255 41700 42158 45211
8th row: 91 1485 1733 11624 12969 17531 21324 23657 27148 27509 28753 35093 43352 48104 51648
9th row: 18 34 117 6739 8679 11018 12163 16733 24113 25906 30605 32700 36465 40799 43359
10th row: 481 1545 1644 4216 4606 6015 6609 14659 16966 18056 19137 26670 28001 30668 49061
11st row: 174 1208 1387 10580 11507 13751 16344 22735 23559 26492 27672 33399 44787 44842 45992
12nd row: 1151 1185 1472 6727 10701 14755 15688 17441 21281 23692 23994 31366 35854 37301 43148
13rd row: 200 799 1583 3451 5880 7604 8194 13428 16109 18584 20463 22373 31977 47073 50087
14th row: 346 843 1352 13409 17376 18233 19119 19382 20578 24183 32052 32912 43204 48539 49893
15th row: 76 457 1169 13516 14520 14638 22391 25294 31067 31325 36711 44072 44854 49274 51624
16th row: 759 798 1420 6661 12101 12573 13796 15510 18384 26649 30875 36856 38994 43634 49281
17th row: 551 797 1000 3999 10040 11246 15793 23298 23822 38480 39209 45334 46603 46625 47633
18th row: 441 875 1554 5336 25948 28842 30329 31503 39203 39673 46250 47021 48555 49229 51421
19th row: 963 1470 1642 3180 3943 6513 9125 15641 17083 18876 28499 32764 42420 43922 45762
20th row: 293 324 867 8803 10582 17926 19830 22497 24848 30034 34659 37721 41523 42534 47806
21st row: 687 975 1356 2721 3002 3874 4119 12336 17119 21251 22482 22833 24681 26225 48514
22nd row: 549 951 1268 9144 11710 12623 18949 19362 22769 32603 34559 34683 36338 47140 51069
23rd row: 52 890 1669 3905 5670 14712 18314 22297 30328 33389 35447 35512 35516 40587 41918
24th row: 656 1063 1694 3338 3793 4513 6009 7441 13393 20920 26501 27576 29623 31261 42093
25th row: 425 1018 1086 9226 10024 17552 24714 24877 25853 28918 30945 31205 33103 42564 47214
26th row: 32 1145 1438 4916 4945 14830 17505 19919 24118 28506 30173 31754 34230 48608 50291
27th row: 559 1216 1272 2856 8703 9371 9708 16180 19127 24337 26390 36649 41105 42988 44096
28th row: 362 658 1191 7769 8998 14068 15921 18471 18780 31995 32798 32864 37293 39468 44308
29th row: 1136 1389 1785 8800 12541 14723 15210 15859 26569 30127 31357 32898 38760 50523 51715
30th row: 44 80 1368 2010 2228 6614 6767 9275 25237 30208 39537 42041 49906 50701 51199
31st row: 1522 1536 1765 3914 5350 10869 12278 12886 16379 22743 23987 26306 30966 33854 41356
32nd row: 212 648 709 3443 7007 7545 12484 13358 17008 20433 25862 31945 39207 39752 40313
33rd row: 789 1062 1431 12280 17415 18098 23729 37278 38454 38763 41039 44600 50700 51139 51696
34th row: 825 1298 1391 4882 12738 17569 19177 19896 27401 37041 39181 39199 41832 43636 45775
35th row: 992 1053 1485 3806 16929 18596 22017 23435 23932 30211 30390 34469 37213 46220 49646
36th row: 771 850 1039 5180 7653 13547 17980 23365 25318 34374 36115 38753 42993 49696 51031
37th row: 7383 14780 15959 18921 22579 28612 32038 36727 40851 41947 42707 50480
38th row: 8733 9464 13148 13899 19396 22933 23039 25047 29938 33588 33796 48930
39th row: 2493 12555 16706 23905 35400 36330 37065 38866 40305 43807 43917 50621
40th row: 6437 11927 14542 16617 17317 17755 18832 24772 29273 31136 36925 46663
41st row: 2191 3431 6288 6430 9908 13069 23014 24822 29818 39914 46010 47246

The accumulation may be performed while the rows of the sequence are being repeatedly changed by the CPM size of the PCM.

In accordance with an aspect of the present invention, there is provided an LDPC encoding method, including initializing first memory configured to store an LDPC codeword having a length of 64800 and a code rate of 3/15 and second memory; and generating the LDPC codeword corresponding to information bits by performing accumulation with respect to the second memory using a sequence corresponding to a PCM.

The accumulation may be performed at parity bit addresses that are updated using the sequence corresponding to the PCM.

The LDPC codeword may include a systematic part corresponding to the information bits and having a length of 12960, a first parity part corresponding to a dual diagonal matrix included in the PCM and having a length of 1800, and a second parity part corresponding to an identity matrix included in the PCM and having a length of 50040.

The sequence may have a number of rows equal to the sum of a value obtained by dividing a length of the systematic part, that is, 12960, by a circulant permutation matrix (CPM) size corresponding to the PCM, that is, 360, and a value obtained by dividing a length of the first parity part, that is, 1800, by the CPM size.

The sequence may be represented by the above Sequence Table.

In accordance with still another aspect of the present invention, there is provided an LDPC decoder, including a receiving unit configured to receive an LDPC codeword encoded using a sequence corresponding to a PCM and is represented by the above Sequence Table; and a decoding unit configured to restore information bits from the received LDPC codeword by performing decoding corresponding to the PCM.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
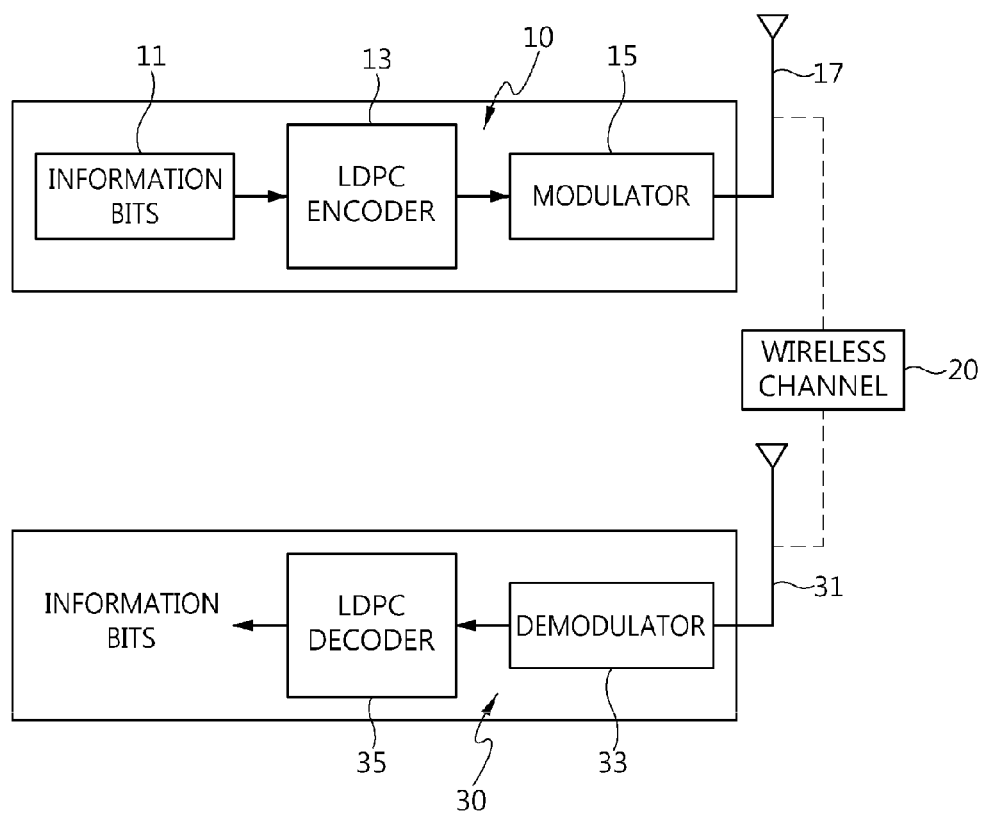
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a transmitter 10 and a receiver 30 communicate with each other over a wireless channel 20.

The transmitter 10 generates an n-bit codeword by encoding k information bits using an LDPC encoder 13. The codeword is modulated by the modulator 15, and is transmitted via an antenna 17. The signal transmitted via the wireless channel 20 is received via the antenna 31 of the receiver 30, and, in the receiver 30, is subjected to a process reverse to the process in the transmitter 10. That is, the received data is demodulated by a demodulator 33, and is then decoded by an LDPC decoder 35, thereby finally restoring the information bits.

It will be apparent to those skilled in the art that the above-described transmission and reception processes have been described within a minimum range required for a description of the features of the present invention and various processes required for data transmission may be added.

In the following, the specific processes of encoding and decoding that are performed using an LDPC code in the LDPC encoder 13 or LDPC decoder 35 and the specific configurations of encoding and decoding devices, such as the LDPC encoder 13 and the LDPC decoder 35, are described. The LDPC encoder 13 illustrated in FIG. 1 may have a structure illustrated in FIG. 4, and the LDPC decoder 35 may have a structure illustrated in FIG. 5.

Figure 2:
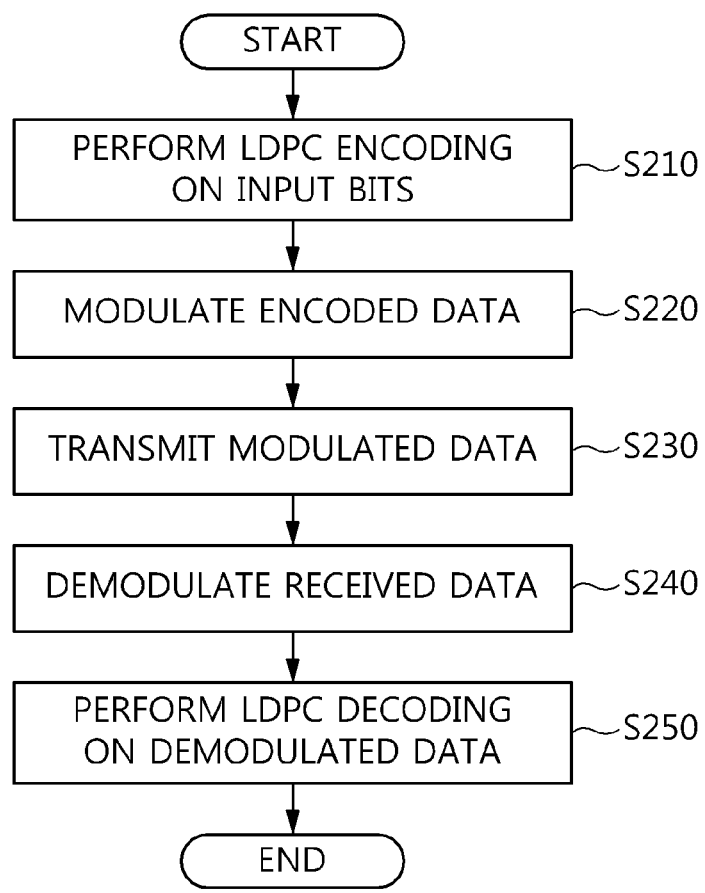
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to LDPC encoding at step S210.

That is, at step S210, an n-bit codeword is generated by encoding k information bits using the LDPC encoder.

Figure 6:
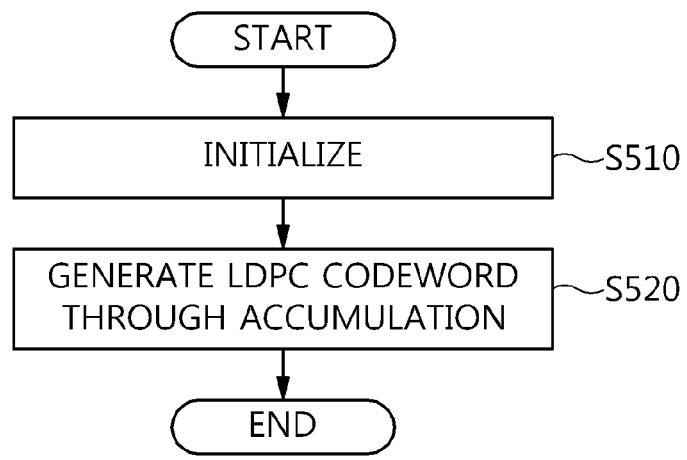
FIG. 6 is an operation flowchart illustrating an LDPC encoding method according to an embodiment of the present invention.

In this case, step S210 may be performed as in an LDPC encoding method illustrated in FIG. 6.

Furthermore, in the broadcast signal transmission and reception method, the encoded data is modulated at step S220.

That is, at step S220, the encoded n-bit codeword is modulated using the modulator.

Furthermore, in the broadcast signal transmission and reception method, the modulated data is transmitted at step S230.

That is, at step S230, the modulated codeword is transmitted over a wireless channel via the antenna.

Furthermore, in the broadcast signal transmission and reception method, the received data is demodulated at step S240.

That is, at step S240, the signal transmitted over the wireless channel is received via the antenna of the receiver, and the received data is demodulated using the demodulator.

Furthermore, in the broadcast signal transmission and reception method, the demodulated data is subjected to LDPC decoding at step S250.

That is, at step S250, the information bits are finally restored by performing LDPC decoding using the demodulator of the receiver.

Figure 5:
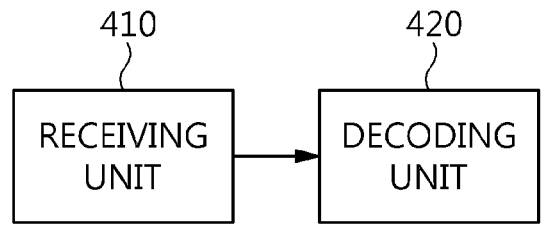
FIG. 5 is a block diagram illustrating an LDPC decoder according to an embodiment of the present invention.

In this case, step S250 corresponds to a process reverse to that of the LDPC encoding method illustrated in FIG. 6, and may correspond to the LDPC decoder of FIG. 5.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
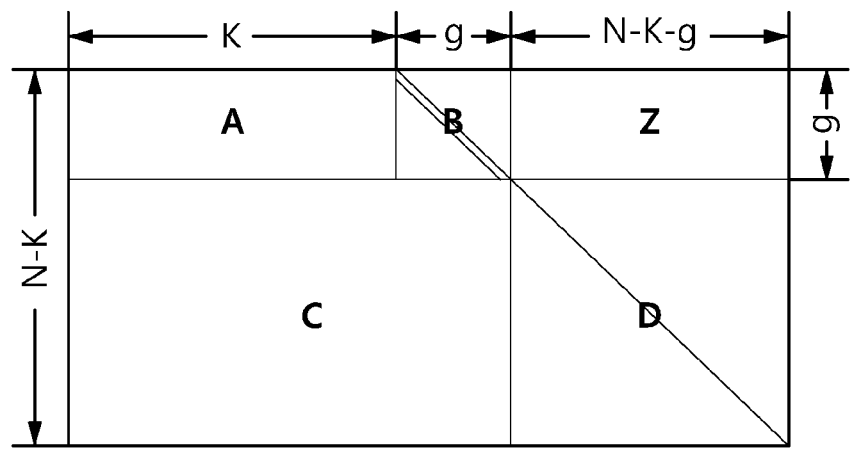
FIG. 3 is a diagram illustrating the structure of a PCM corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 3/15 and the length of a codeword is 64800, as illustrated in the following Table 1. That is, the present invention proposes an LDPC code that is designed to receive information having a length of 12960 and generate an LDPC codeword having a length of 64800.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 3/15 | 64800 | 1800 × 12960 | 1800 × 1800 | 50040 × 14760 | 50040 × 50040 | 1800 × 50040 |

The newly designed LDPC code may be represented in the form of a sequence (progression), an equivalent relationship is established between the sequence and matrix (parity bit check matrix), and the sequence may be represented, as follows:

Sequence Table

1st row: 920 963 1307 2648 6529 17455 18883 19848 19909 24149 24249 38395 41589 48032 50313
2nd row: 297 736 744 5951 8438 9881 15522 16462 23036 25071 34915 41193 42975 43412 49612
3rd row: 10 223 879 4662 6400 8691 14561 16626 17408 22810 31795 32580 43639 45223 47511
4th row: 629 842 1666 3150 7596 9465 12327 18649 19052 19279 29743 30197 40106 48371 51155

-continued

Sequence Table

5th row: 857 953 1116 8725 8726 10508 17112 21007 30649 32113 36962 39254 46636 49599 50099
6th row: 700 894 1128 5527 6216 15123 21510 24584 29026 31416 37158 38460 42511 46932 51832
7th row: 430 592 1521 3018 10430 18090 18092 18388 20017 34383 35006 38255 41700 42158 45211
8th row: 91 1485 1733 11624 12969 17531 21324 23657 27148 27509 28753 35093 43352 48104 51648
9th row: 18 34 117 6739 8679 11018 12163 16733 24113 25906 30605 32700 36465 40799 43359
10th row: 481 1545 1644 4216 4606 6015 6609 14659 16966 18056 19137 26670 28001 30668 49061
11st row: 174 1208 1387 10580 11507 13751 16344 22735 23559 26492 27672 33399 44787 44842 45992
12nd row: 1151 1185 1472 6727 10701 14755 15688 17441 21281 23692 23994 31366 35854 37301 43148
13rd row: 200 799 1583 3451 5880 7604 8194 13428 16109 18584 20463 22373 31977 47073 50087
14th row: 346 843 1352 13409 17376 18233 19119 19382 20578 24183 32052 32912 43204 48539 49893
15th row: 76 457 1169 13516 14520 14638 22391 25294 31067 31325 36711 44072 44854 49274 51624
16th row: 759 798 1420 6661 12101 12573 13796 15510 18384 26649 30875 36856 38994 43634 49281
17th row: 551 797 1000 3999 10040 11246 15793 23298 23822 38480 39209 45334 46603 46625 47633
18th row: 441 875 1554 5336 25948 28842 30329 31503 39203 39673 46250 47021 48555 49229 51421
19th row: 963 1470 1642 3180 3943 6513 9125 15641 17083 18876 28499 32764 42420 43922 45762
20th row: 293 324 867 8803 10582 17926 19830 22497 24848 30034 34659 37721 41523 42534 47806
21st row: 687 975 1356 2721 3002 3874 4119 12336 17119 21251 22482 22833 24681 26225 48514
22nd row: 549 951 1268 9144 11710 12623 18949 19362 22769 32603 34559 34683 36338 47140 51069
23rd row: 52 890 1669 3905 5670 14712 18314 22297 30328 33389 35447 35512 35516 40587 41918
24th row: 656 1063 1694 3338 3793 4513 6009 7441 13393 20920 26501 27576 29623 31261 42093
25th row: 425 1018 1086 9226 10024 17552 24714 24877 25853 28918 30945 31205 33103 42564 47214
26th row: 32 1145 1438 4916 4945 14830 17505 19919 24118 28506 30173 31754 34230 48608 50291
27th row: 559 1216 1272 2856 8703 9371 9708 16180 19127 24337 26390 36649 41105 42988 44096
28th row: 362 658 1191 7769 8998 14068 15921 18471 18780 31995 32798 32864 37293 39468 44308
29th row: 1136 1389 1785 8800 12541 14723 15210 15859 26569 30127 31357 32898 38760 50523 51715
30th row: 44 80 1368 2010 2228 6614 6767 9275 25237 30208 39537 42041 49906 50701 51199
31st row: 1522 1536 1765 3914 5350 10869 12278 12886 16379 22743 23987 26306 30966 33854 41356
32nd row: 212 648 709 3443 7007 7545 12484 13358 17008 20433 25862 31945 39207 39752 40313
33rd row: 789 1062 1431 12280 17415 18098 23729 37278 38454 38763 41039 44600 50700 51139 51696
34th row: 825 1298 1391 4882 12738 17569 19177 19896 27401 37041 39181 39199 41832 43636 45775
35th row: 992 1053 1485 3806 16929 18596 22017 23435 23932 30211 30390 34469 37213 46220 49646
36th row: 771 850 1039 5180 7653 13547 17980 23365 25318 34374 36115 38753 42993 49696 51031
37th row: 7383 14780 15959 18921 22579 28612 32038 36727 40851 41947 42707 50480
38th row: 8733 9464 13148 13899 19396 22933 23039 25047 29938 33588 33796 48930
39th row: 2493 12555 16706 23905 35400 36330 37065 38866 40305 43807 43917 50621
40th row: 6437 11927 14542 16617 17317 17755 18832 24772 29273 31136 36925 46663
41st row: 2191 3431 6288 6430 9908 13069 23014 24822 29818 39914 46010 47246

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \qquad (4)$$

First information bit $\lambda_0$ is accumulated at parity bit addresses specified in the 1st row of the sequence of the Sequence Table. For example, in an LDPC code having a length of 64800 and a code rate of 3/15, an accumulation process is as follows:

$p_{920} = p_{920} \oplus \lambda_0 \quad p_{963} = p_{963} \oplus \lambda_0 \quad p_{1307} = p_{1307} \oplus \lambda_0 \quad p_{2648} = p_{2648} \oplus \lambda_0 \quad p_{6529} = p_{6529} \oplus \lambda_0$
$p_{17455} = p_{17455} \oplus \lambda_0 \quad p_{18883} = p_{18883} \oplus \lambda_0 \quad p_{19848} = p_{19848} \oplus \lambda_0 \quad p_{19909} = p_{19909} \oplus \lambda_0 \quad p_{24149} = p_{24149} \oplus \lambda_0$
$p_{24249} = p_{24249} \oplus \lambda_0 \quad p_{38395} = p_{38395} \oplus \lambda_0 \quad p_{41589} = p_{41589} \oplus \lambda_0 \quad p_{48032} = p_{48032} \oplus \lambda_0 \quad p_{50313} = p_{50313} \oplus \lambda_0$ where the addition $\oplus$ occurs in GF(2).

The subsequent L−1 information bits, that is, $\lambda_m$, $m=1, 2, \ldots, L-1$, are accumulated at parity bit addresses that are calculated by the following Equation 5:

$$(x+m \times Q_1) \bmod M_1 \text{ if } x < M_1$$

$$M_1 + \{(x-M_1+m \times Q_2) \bmod M_2\} \text{ if } x \geq M_1 \qquad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and $L=360$. Furthermore, $Q_1$ and $Q_2$ are defined in the following Table 2. For example, for an LDPC code having a length of 64800 and a code rate of 3/15, $M_1=1800$, $Q_1=5$, $M_2=50040$, $Q_2=139$ and $L=360$, and the following operations are performed on the second bit $\lambda_1$ using Equation 5:

$p_{925} = p_{925} \oplus \lambda_1 \quad p_{968} = p_{968} \oplus \lambda_1 \quad p_{1312} = p_{1312} \oplus \lambda_1 \quad p_{2787} = p_{2787} \oplus \lambda_1 \quad p_{6668} = p_{6668} \oplus \lambda_1$
$p_{17594} = p_{17594} \oplus \lambda_1 \quad p_{19022} = p_{19022} \oplus \lambda_1 \quad p_{19987} = p_{19987} \oplus \lambda_1 \quad p_{20048} = p_{20048} \oplus \lambda_1 \quad p_{24288} = p_{24288} \oplus \lambda_1$
$p_{24388} = p_{24388} \oplus \lambda_1 \quad p_{38534} = p_{38534} \oplus \lambda_1 \quad p_{41728} = p_{41728} \oplus \lambda_1 \quad p_{48171} = p_{48171} \oplus \lambda_1 \quad p_{50452} = p_{50452} \oplus \lambda_1$ Table 2 illustrates the sizes of $M_1$, $Q_1$, $M_2$ and $Q_2$ of the designed QC-LDPC code:

TABLE 2

| Code rate | Length | Sizes | | | |
|---|---|---|---|---|---|
| | | $M_1$ | $M_2$ | $Q_1$ | $Q_2$ |
| 3/15 | 64800 | 1800 | 50040 | 5 | 139 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots,M_1-1 \qquad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L, 0 \leq t < Q_1 \qquad (7)$$

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \leq s < L, 0 \leq t < Q_2 \qquad (8)$$

Figure 4:
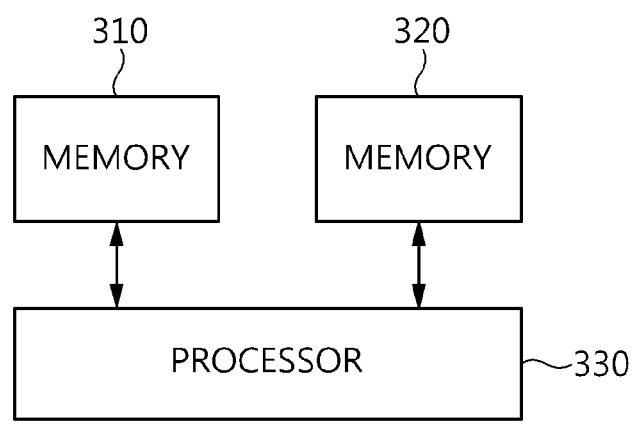
FIG. 4 is a block diagram illustrating an LDPC encoder according to an embodiment of the present invention.

FIG. 4 is a block diagram illustrating an LDPC encoder according to an embodiment of the present invention.

Referring to FIG. 4, the LDPC encoder according to this embodiment of the present invention includes memory 310 and 320 and a processor 330.

The memory 310 is memory that is used to store an LDPC codeword having a length of 64800 and a code rate of 3/15.

The memory 320 is memory that is initialized to 0.

The memory 310 and the memory 320 may correspond to $\lambda_i$ (i=0, 1, ..., N−1) and $p_j$ (j=0, 1, ..., $M_1+M_2-1$), respectively.

The memory 310 and the memory 320 may correspond to various types of hardware for storing sets of bits, and may correspond to data structures, such as an array, a list, a stack and a queue.

The processor 330 generates an LDPC codeword corresponding to information bits by performing accumulation with respect to the memory 320 using a sequence corresponding to a PCM.

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 12960 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1}+1, \ldots, \lambda_{K+M_1+M_2-1}$ corresponding to an identity matrix included in the PCM and having a length of 50040 (=$M_2$).

In this case, the sequence may have a number of rows equal to the sum (12960/360+1800/360=41) of a value obtained by dividing the length of the systematic part, that is, 12960, by a CPM size L corresponding to the PCM, that is, 360, and a value obtained by dividing the length $M_1$ of the first parity part, that is, 1800, by 360.

As described above, the sequence may be represented by the above Sequence Table.

In this case, the memory 320 may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1$/L, $M_1$ may be the size of the first parity part, $Q_2$ may be $M_2$/L, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1}+1, \ldots, \lambda_{K+M_1}+M_2-1$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

FIG. 5 is a block diagram illustrating an LDPC decoder according to an embodiment of the present invention.

Referring to FIG. 5, the LDPC decoder according to this embodiment of the present invention may include a receiving unit 410 and a decoding unit 420.

The receiving unit 410 receives an LDPC codeword that has been encoded using a sequence that corresponds to a PCM and is represented by the above Sequence Table.

The decoding unit 420 restores information bits from the received LDPC codeword by performing decoding corresponding to the PCM.

In this case, the sequence may be used to update the parity bit addresses of the memory, and the parity bit addresses are used for accumulation that is performed to generate parity bits corresponding to the LDPC codeword.

In this case, the LDPC codeword may include a systematic part $\lambda_0, \lambda_1, \ldots, \lambda_{K-1}$ corresponding to the information bits, a first parity part $\lambda_K, \lambda_{K+1}, \ldots, \lambda_{K+M_1-1}$ corresponding to a dual diagonal matrix included in the PCM, and a second parity part $\lambda_{K+M_1}, \lambda_{K+M_1}+1, \ldots, \lambda_{K+M_1+M_2}-1$ corresponding to an identity matrix included in the PCM.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1$/L, $M_1$ may be the size of the first parity part, $Q_2$ may be $M_2$/L, and $M_2$ may be the size of the second parity part.

FIG. 6 is an operation flowchart illustrating an LDPC encoding method according to an embodiment of the present invention.

Referring to FIG. 6, the LDPC encoding method according to this embodiment of the present invention initializes the first memory that stores an LDPC codeword having a length of 64800 and a code rate of 3/15, and second memory at step S510.

In this case, step S510 may be performed using Equation 4.

Furthermore, in the LDPC encoding method according to this embodiment of the present invention, an LDPC codeword corresponding to information bits is generated by performing accumulation with respect to the second memory using a sequence corresponding to a PCM at step S520.

In this case, the accumulation may be performed at parity bit addresses that are updated using the sequence corresponding to the PCM.

In this case, the LDPC codeword may include a systematic part $\lambda_0, \lambda_1, \ldots, \lambda_{K-1}$ corresponding to the information bits and having a length of 12960 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K+M_1}, \lambda_{K+M_1}+1, \ldots, \lambda_{K+M_1+M_2-1}$ corresponding to an identity matrix included in the PCM and having a length of 50040 (=$M_2$).

In this case, the sequence may have a number of rows equal to the sum (12960/360+1800/360=41) of a value obtained by dividing the length of the systematic part, that is, 12960, by a CPM size L corresponding to the PCM, that is, 360, and a value obtained by dividing the length $M_1$ of the first parity part, that is, 1800, by 360.

As described above, the sequence may be represented by the above Sequence Table.

In this case, the parity bit addresses may be updated based on the results of comparing each x of the previous parity bit addresses specified in respective rows of the sequence with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1$/L, $M_1$ may be the size of the first parity part, $Q_2$ may be $M_2$/L, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1-1}$ may be generated by performing parity interleaving using the memory 310 and the memory 320, as described in conjunction with Equation 7.

In this case, the second parity part $\lambda_{K+M_1}, \lambda_{K+M_1}+1, \ldots, \lambda_{K+M_1+M_2-1}$ may be generated by performing parity interleaving using the memory 310 and the memory 320 after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 7:
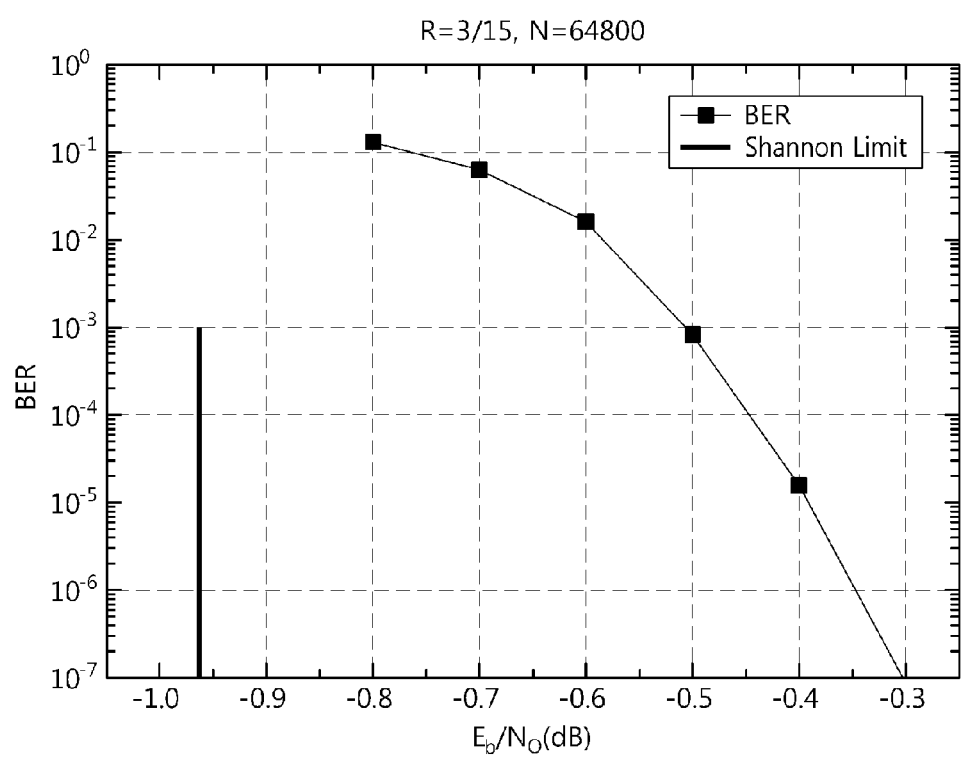
FIG. 7 is a graph plotting the performance of a QC-LDPC code having a length of 64800 and a code rate of 3/15 according to an embodiment of the present invention against $E_b/N_o$.

FIG. 7 is a graph plotting the performance of a QC-LDPC code having a length of 64800 and a code rate of 3/15 according to an embodiment of the present invention against $E_b/N_o$.

The graph illustrated in FIG. 7 illustrates results that were obtained on the assumption that a log-likelihood ratio (LLR)-based sum-product algorithm in which binary phase shift keying (BPSK) modulation and 50 rounds of repetitive decoding were performed was used for computational experiments. As illustrated in FIG. 7, it can be seen that the designed code is away from the Shannon limit by about 0.6 dB at BER=$10^{-6}$.

At least one embodiment of the present invention has the advantage of providing a new LDPC codeword having a length of 64800 and a code rate of 3/15, which is capable of being used for general purposes.

At least one embodiment of the present invention has the advantage of providing an LDPC encoding technique that is capable of efficiently performing LDPC encoding using a sequence having a number of rows equal to a value that is obtained by dividing the sum of the length of the systematic part of an LDPC codeword, that is, 12960, and the length of the first parity part of the LDPC codeword, that is, 1800, by 360.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A low density parity check (LDPC) encoder, comprising:

first memory configured to store an LDPC codeword having a length of 64800 bits and a code rate of 3/15;

second memory configured to be initially set to 0 and to be used for generating parity bits of the LDPC codeword; and a processor configured to generate the LDPC codeword corresponding to information bits by performing accumulation which is performed at parity bit addresses of the second memory, the parity bit addresses being updated using a sequence corresponding to a parity check matrix (PCM), wherein the sequence is represented by the following Sequence Table:

| Sequence Table |
|---|
| 1st row: 920 963 1307 2648 6529 17455 18883 19848 19909 24149 24249 38395 41589 48032 50313 |
| 2nd row: 297 736 744 5951 8438 9881 15522 16462 23036 25071 34915 41193 42975 43412 49612 |
| 3rd row: 10 223 879 4662 6400 8691 14561 16626 17408 22810 31795 32580 43639 45223 47511 |
| 4th row: 629 842 1666 3150 7596 9465 12327 18649 19052 19279 29743 30197 40106 48371 51155 |
| 5th row: 857 953 1116 8725 8726 10508 17112 21007 30649 32113 36962 39254 46636 49599 50099 |
| 6th row: 700 894 1128 5527 6216 15123 21510 24584 29026 31416 37158 38460 42511 46932 51832 |
| 7th row: 430 592 1521 3018 10430 18090 18092 18388 20017 34383 35006 38255 41700 42158 45211 |
| 8th row: 91 1485 1733 11624 12969 17531 21324 23657 27148 27509 28753 35093 43352 48104 51648 |
| 9th row: 18 34 117 6739 8679 11018 12163 16733 24113 25906 30605 32700 36465 40799 43359 |
| 10th row: 481 1545 1644 4216 4606 6015 6609 14659 16966 18056 19137 26670 28001 30668 49061 |
| 11st row: 174 1208 1387 10580 11507 13751 16344 22735 23559 26492 27672 33399 44787 44842 45992 |
| 12nd row: 1151 1185 1472 6727 10701 14755 15688 17441 21281 23692 23994 31366 35854 37301 43148 |
| 13rd row: 200 799 1583 3451 5880 7604 8194 13428 16109 18584 20463 22373 31977 47073 50087 |
| 14th row: 346 843 1352 13409 17376 18233 19119 19382 20578 24183 32052 32912 43204 48539 49893 |
| 15th row: 76 457 1169 13516 14520 14638 22391 25294 31067 31325 36711 44072 44854 49274 51624 |
| 16th row: 759 798 1420 6661 12101 12573 13796 15510 18384 26649 30875 36856 38994 43634 49281 |
| 17th row: 551 797 1000 3999 10040 11246 15793 23298 23822 38480 39209 45334 46603 46625 47633 |
| 18th row: 441 875 1554 5336 25948 28842 30329 31503 39203 39673 46250 47021 48555 49229 51421 |
| 19th row: 963 1470 1642 3180 3943 6513 9125 15641 17083 18876 28499 32764 42420 43922 45762 |
| 20th row: 293 324 867 8803 10582 17926 19830 22497 24848 30034 34659 37721 41523 42534 47806 |
| 21st row: 687 975 1356 2721 3002 3874 4119 12336 17119 21251 22482 22833 24681 26225 48514 |
| 22nd row: 549 951 1268 9144 11710 12623 18949 19362 22769 32603 34559 34683 36338 47140 51069 |
| 23rd row: 52 890 1669 3905 5670 14712 18314 22297 30328 33389 35447 35512 35516 40587 41918 |

-continued

| Sequence Table |
|---|
| 24th row: 656 1063 1694 3338 3793 4513 6009 7441 13393 20920 26501 27576 29623 31261 42093 |
| 25th row: 425 1018 1086 9226 10024 17552 24714 24877 25853 28918 30945 31205 33103 42564 47214 |
| 26th row: 32 1145 1438 4916 4945 14830 17505 19919 24118 28506 30173 31754 34230 48608 50291 |
| 27th row: 559 1216 1272 2856 8703 9371 9708 16180 19127 24337 26390 36649 41105 42988 44096 |
| 28th row: 362 658 1191 7769 8998 14068 15921 18471 18780 31995 32798 32864 37293 39468 44308 |
| 29th row: 1136 1389 1785 8800 12541 14723 15210 15859 26569 30127 31357 32898 38760 50523 51715 |
| 30th row: 44 80 1368 2010 2228 6614 6767 9275 25237 30208 39537 42041 49906 50701 51199 |
| 31st row: 1522 1536 1765 3914 5350 10869 12278 12886 16379 22743 23987 26306 30966 33854 41356 |
| 32nd row: 212 648 709 3443 7007 7545 12484 13358 17008 20433 25862 31945 39207 39752 40313 |
| 33rd row: 789 1062 1431 12280 17415 18098 23729 37278 38454 38763 41039 44600 50700 51139 51696 |
| 34th row: 825 1298 1391 4882 12738 17569 19177 19896 27401 37041 39181 39199 41832 43636 45775 |
| 35th row: 992 1053 1485 3806 16929 18596 22017 23435 23932 30211 30390 34469 37213 46220 49646 |
| 36th row: 771 850 1039 5180 7653 13547 17980 23365 25318 34374 36115 38753 42993 49696 51031 |
| 37th row: 7383 14780 15959 18921 22579 28612 32038 36727 40851 41947 42707 50480 |
| 38th row: 8733 9464 13148 13899 19396 22933 23039 25047 29938 33588 33796 48930 |
| 39th row: 2493 12555 16706 23905 35400 36330 37065 38866 40305 43807 43917 50621 |
| 40th row: 6437 11927 14542 16617 17317 17755 18832 24772 29273 31136 36925 46663 |
| 41st row: 2191 3431 6288 6430 9908 13069 23014 24822 29818 39914 46010 47246. |

2. The LDPC encoder of claim 1, wherein the LDPC codeword comprises a systematic part corresponding to the information bits and having a length of 12960 bits, a first parity part corresponding to a dual diagonal matrix included in the PCM and having a length of 1800 bits, and a second parity part corresponding to an identity matrix included in the PCM and having a length of 50040 bits.

3. The LDPC encoder of claim 2, wherein the sequence has a number of rows equal to a sum of a value obtained by dividing the length of the systematic part by a circulant permutation matrix (CPM) size corresponding to the PCM, and a value obtained by dividing the length of the first parity part, by the CPM size.

4. The LDPC encoder of claim 3, wherein the accumulation is performed while the rows of the sequence are being repeatedly changed by the CPM size of the PCM.

* * * * *